(12) United States Patent
Ye (10) Patent No.: US 10,784,473 B2
(45) Date of Patent: Sep. 22, 2020

(54) MANUFACTURING METHOD OF A DISPLAY SCREEN

(71) Applicant: Wuhan China Star Optoelectronics Semiconductor Display Technology Co., Ltd., Wuhan (CN)

(72) Inventor: Jian Ye, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/349,263

(22) PCT Filed: Jan. 16, 2019

(86) PCT No.: PCT/CN2019/071946
§ 371 (c)(1),
(2) Date: May 12, 2019

(87) PCT Pub. No.: WO2020/113783
PCT Pub. Date: Jun. 11, 2020

(65) Prior Publication Data
US 2020/0212370 A1     Jul. 2, 2020

(30) Foreign Application Priority Data
Dec. 6, 2018   (CN) .......................... 2018 1 1486645

(51) Int. Cl.
*H01L 51/56*    (2006.01)
*H01L 27/32*    (2006.01)
(Continued)

(52) U.S. Cl.
CPC .......... *H01L 51/56* (2013.01); *H01L 27/3227* (2013.01); *H01L 27/3244* (2013.01);
(Continued)

(58) Field of Classification Search
CPC . H01L 51/56; H01L 51/0097; H01L 51/5253; H01L 51/5256; H01L 2251/5338;
(Continued)

(56) References Cited

U.S. PATENT DOCUMENTS

2017/0148856 A1\* 5/2017 Choi .................. H01L 27/3258
2017/0162637 A1\* 6/2017 Choi .................. H01L 27/3246
(Continued)

FOREIGN PATENT DOCUMENTS

CN    106847743    6/2017
CN    107658332    2/2018
(Continued)

*Primary Examiner* — Michael M Trinh (57) ABSTRACT

Provided herewith is a method for manufacturing the display screen, which includes sequentially forming a switch array layer and an organic light-emitting display layer on a flexible substrate; forming a first encapsulation layer on the organic light-emitting display layer; defining a first portion of a via hole in the first encapsulation layer; forming a second encapsulation layer in the first portion of the via hole and on the first encapsulation layer; removing a part of the second encapsulation layer corresponding to a position of the preset camera hole; defining a second portion of the via hole in the flexible substrate to obtain the via hole completely. Since the inner wall of the via hole of the camera of the disclosure is provided with the encapsulation layer, the encapsulation effect and the reliability of the encapsulation are improved.

20 Claims, 5 Drawing Sheets

(51) Int. Cl.
*H01L 51/00* (2006.01)
*H01L 51/52* (2006.01)

(52) U.S. Cl.
CPC ...... *H01L 51/0097* (2013.01); *H01L 51/5253* (2013.01); *H01L 51/5256* (2013.01); *H01L 2251/5338* (2013.01)

(58) Field of Classification Search
CPC ............. H01L 27/3227; H01L 27/3225; H01L 27/3244; H01L 2227/323
See application file for complete search history.

(56) References Cited

U.S. PATENT DOCUMENTS

| | | | |
|---|---|---|---|
| 2018/0151834 A1* | 5/2018 | Kanaya | H01L 51/5246 |
| 2018/0286893 A1 | 10/2018 | Liu | |
| 2018/0294436 A1* | 10/2018 | Choi | H01L 51/003 |
| 2019/0123115 A1* | 4/2019 | Sun | H01L 27/3225 |
| 2019/0245160 A1* | 8/2019 | Yoon | H01L 27/3244 |
| 2019/0252415 A1 | 8/2019 | Wan et al. | |
| 2019/0305252 A1* | 10/2019 | Dai | H01L 27/32 |

FOREIGN PATENT DOCUMENTS

| | | |
|---|---|---|
| CN | 108400152 | 8/2018 |
| CN | 108428728 | 8/2018 |
| CN | 108666353 | 10/2018 |

* cited by examiner

MANUFACTURING METHOD OF A DISPLAY SCREEN

RELATED APPLICATIONS

This application is a National Phase of PCT Patent Application No. PCT/CN2019/071946 having International filing date of Jan. 16, 2019, which claims the benefit of priority of Chinese Patent Application No. 201811486645.5 filed on Dec. 6, 2018. The contents of the above applications are all incorporated by reference as if fully set forth herein in their entirety.

FIELD AND BACKGROUND OF THE INVENTION

The disclosure is related to the field of display technologies, and more particularly, to a manufacturing method of a display screen.

With the rapid development of full-screen terminals, the demand of large screen-to-body ratio is getting higher and higher. Taking mobile phones as an example, only the non-display area is reserved at the top position of the mobile phone to set the camera, and the rest are display areas.

In order to achieve a larger screen-to-body ratio, a circular via hole design is usually adopted in the screen, that is, a circular via hole is defined at the position of the camera, thereby further reducing the non-display area of the smartphone.

In order to improve the packaging effect, the existing display screen is produced by not depositing an organic light-emitting material and a metal film layer such as a cathode at the position for defining the circular via hole, and the organic light-emitting devices of the OLED screen are formed by evaporation coating by mainly using a mask with a full opening (Open Mask). However, the traditional Open Mask defines the evaporation area by means of a hole middle opening. Therefore, the position for forming the circular hole is also vapor-deposited with a functional film layer such as an HIL (hole injection layer) or HTL (hole transport layer), and metal/organic/inorganic film layers such as cathode, capping layer, and LiF of the OLED. After, the subsequent cutting process for defining the circular hole, water vapor, oxygen, etc. may penetrate into the OLEDs through the remaining organic vapor-deposited film layer of the cut section, which reduces the packaging effect of the display screen.

Therefore, it is necessary to provide a method of manufacturing a display screen to solve the problems of the prior art.

SUMMARY OF THE INVENTION

In order to solve the above technical problem, one purpose of the disclosure is to provide a method for manufacturing the display screen, which can improve the packaging effect of the display screen. The method includes sequentially forming a switch array layer and an organic light-emitting display layer on a flexible substrate; forming a first encapsulation layer on the organic light-emitting display layer; defining a first portion of a via hole in the first encapsulation layer; an orthographic projection of the via hole on the flexible substrate covers an orthographic projection of a preset camera hole on the flexible substrate; wherein the first portion of the via hole extends from the first encapsulation layer to an upper surface of the flexible substrate; forming a second encapsulation layer in the first portion of the via hole and on the first encapsulation layer; removing a part of the second encapsulation layer corresponding to a position of the preset camera hole; defining a second portion of the via hole in the flexible substrate to obtain the via hole completely, wherein a bore diameter of the via hole is larger than bore diameter of the preset camera hole, and a material of the first encapsulation layer comprises at least one of SiNx, SiON and SiO.

Further, the second encapsulation layer comprises a vertical part, and the vertical part is positioned corresponding to the position of the through hole, wherein the vertical part comprises a middle part, and the middle part corresponds to the position of the preset camera hole; and wherein the step of removing a part of second encapsulation layer positioned corresponding to a position of the preset camera hole comprises: removing the middle portion.

Further, the vertical part also comprises a peripheral portion surrounding a perimeter of the middle portion.

Further, the vertical part comprises a part of the second encapsulation layer that is located in the first portion of the via hole and above the via hole and corresponding to the via hole.

Further, the first encapsulation layer comprises a preset area, and the preset area is used for defining the via hole; wherein the step of defining a first portion of the via hole in the first encapsulation layer comprises removing the first encapsulation layer and the organic light-emitting display layer and the switch array layer from the preset area to obtain the first portion of the via hole through an etching process.

Further, the step of removing a part of the second encapsulation layer corresponding to a position of the preset camera hole comprises removing the part of the second encapsulation layer corresponding to the position of the preset camera hole through a dry etching process.

Further, a cross-sectional structure of the display panel further comprises a protection layer, and the protection layer is located below the flexible substrate; wherein the step of defining a second portion of the through hole in the flexible substrate comprises: forming a second portion of the via on the flexible substrate and the protective layer.

Further, in the step of defining a second portion of the via hole in the flexible substrate comprises removing, by laser cutting or mechanical cutting, a part of the flexible substrate corresponding to the preset camera hole to define the second part of the via hole.

Further, the second encapsulation layer comprises inorganic layers and organic layers alternately stacked on each other.

The disclosure further provides a manufacturing method of a display screen, wherein the manufacturing method comprises the following steps: sequentially forming a switch array layer and an organic light-emitting display layer on a flexible substrate; forming a first encapsulation layer on the organic light-emitting display layer; defining a first portion of a via hole in the first encapsulation layer, an orthographic projection of the via hole on the flexible substrate covers an orthographic projection of a preset camera hole on the flexible substrate, wherein the first portion of the via hole extends from the first encapsulation layer to an upper surface of the flexible substrate; forming a second encapsulation layer in the first part of the via hole and on the first encapsulation layer; removing a part of the second encapsulation layer corresponding to a position of the preset camera hole; defining a second portion of the via hole in the flexible substrate to obtain the via hole completely.

Further, a bore diameter of the via hole is larger than a bore diameter of the preset camera hole.

Further, the second encapsulation layer comprises a vertical part, and the vertical part is positioned corresponding to a position of the via hole, wherein the vertical part comprises a middle portion, and the middle portion is positioned corresponding to the position of the preset camera hole; and wherein the step of removing a part of the second encapsulation layer positioned corresponding to a position of the preset camera hole comprises: removing the middle portion.

Further, the vertical part also comprises a peripheral portion surrounding a perimeter of the middle portion.

Further, the vertical part comprises a part of the second encapsulation layer that is located in the first portion of the via hole and above the via hole and corresponding to the via hole.

Further, the first encapsulation layer comprises a preset area, and the preset area is used for defining the via hole; wherein the step of defining a first portion of the via in the first encapsulation layer comprises removing the first encapsulation layer and the organic light-emitting display layer and the switch array layer from the preset area to obtain the first portion of the via hole through an etching process.

Further, the step of removing a part of the second encapsulation layer corresponding to a position of the preset camera hole comprises removing the part of the second encapsulation layer corresponding to the position of the preset camera hole through a dry etching process.

Further, a cross-sectional structure of the display panel further comprises a protection layer, and the protection layer is located below the flexible substrate; wherein the step of defining a second portion of the via hole in the flexible substrate comprises defining the second portion of the via hole in the flexible substrate and the protective layer.

Further, in the step of defining a second portion of the via hole in the flexible substrate comprises removing, by laser cutting or mechanical cutting, a part of the flexible substrate corresponding to the preset camera hole to define the second portion of the via hole.

Further, a material of the first encapsulation layer comprises at least one of SiNx, SiON and SiO.

Further, the second encapsulation layer comprising inorganic layers and organic layers alternately stacked on each other.

BRIEF DESCRIPTION OF THE SEVERAL VIEWS OF THE DRAWINGS

In order to more clearly illustrate the embodiments of the disclosure, the accompanying drawings for illustrating the technical solutions and the technical solutions and the technical solutions of the disclosure are briefly described as below.

DESCRIPTION OF SPECIFIC EMBODIMENTS OF THE INVENTION

The following description with reference to the accompanying drawings is provided to clearly and completely explain the exemplary embodiments of the disclosure. It is apparent that the following embodiments are merely some embodiments of the disclosure rather than all embodiments of the disclosure. According to the embodiments in the disclosure, all the other embodiments attainable by those skilled in the art without creative endeavor belong to the protection scope of the disclosure.

In the figures, in order to clearly identify the elements, the thicknesses of the layers and sections are enlarged. Identical notations can be referred as identical elements in the description and the figures.

It can be realized that the terms "first", "second" and "third" are configured for describing each elements, and the elements are not limited by the terms. These terms merely distinguish one element from another element.

Figure 1:
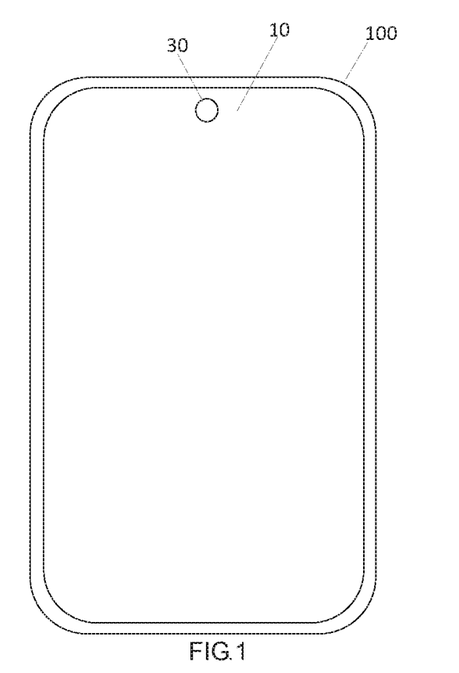
FIG. 1 is a schematic structural view of an electronic device of the disclosure.

Referring to FIGS. 1-6, FIG. 1 is a schematic structural view of an electronic device of the disclosure. Referring to FIG. 1, a display screen of the disclosure can be used in an electronic device 100 having a camera via hole 30 disposed therein. The camera via hole 30 is used to mount a front camera that corresponds to the position of the front camera of the electronic device 100. The camera via hole 30 is a via hole. The electronic device 100 can be a mobile phone, a tablet computer, etc.

Figure 2:
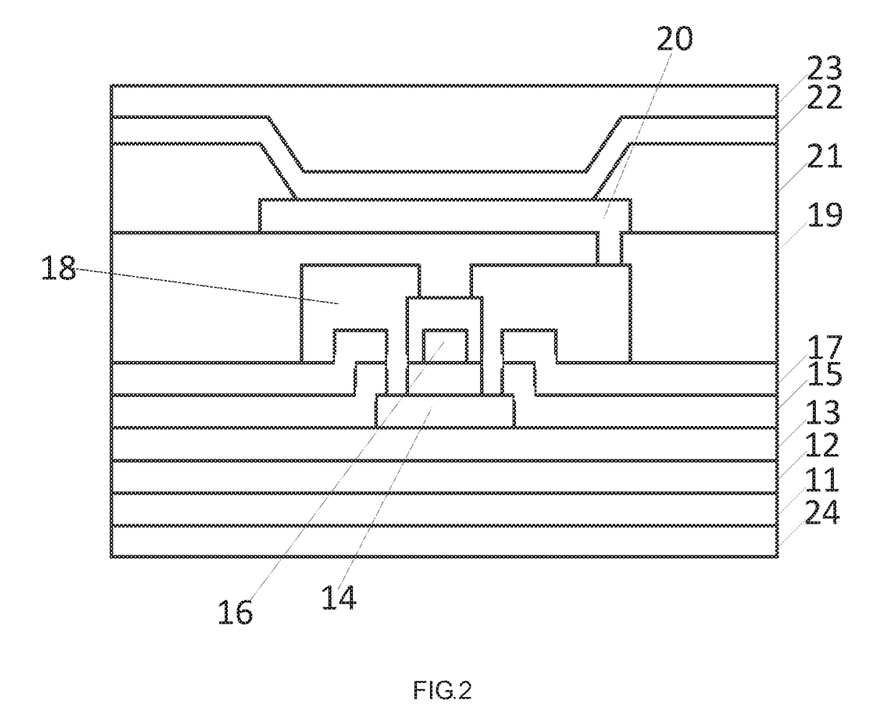
FIG. 2 is a schematic structural view in connection with a first step of the manufacturing method of the display screen of the disclosure.

A manufacturing method of the display screen of the disclosure, includes following steps:

S101, sequentially forming a switch array layer and an organic light-emitting display layer on a flexible substrate.

Referring to FIG. 2, the manufacturing method of the switch array layer includes forming a buffer layer 12, a barrier layer 13, an active layer 14, a first gate insulating layer 15, a gate 16, a second gate insulating layer 17, a second metal layer 18, and an inter-insulation layer 19 on the flexible substrate 11 sequentially. The method can further include forming a protective layer 24 under the flexible substrate 11.

A material of the buffer layer 12 and the barrier layer 13 is at least one of SiNx and SiOx. The active layer 13 is used to form a channel.

The manufacturing method of the gate 16 includes forming the first metal on the first gate insulating layer 15, and then patterning the first metal layer by a mask to form the gate 16.

The manufacturing method of the a second gate insulating layer 17 includes patterning the second gate insulating layer 17 to form the source hole and the drain hole. The source is connected to the active layer 14 through the source hole, and the drain is connected to the active layer 14 through the drain hole.

The manufacturing method of the second metal layer 18 includes forming a second metal layer on the second gate insulating layer 17 and in the source hole and in the drain hole, and then patterning the second metal layer to form the source and the drain.

The manufacturing method of the organic light-emitting display layer includes forming an anode, a pixel defining layer, an organic light emitting layer and a cathode on the first interlayer insulating layer 19 sequentially.

The manufacturing method of the anode includes patterning the first interlayer insulating layer 19 to form a connection hole, forming a conductive layer on the first interlayer insulating layer 19 and in the connection hole, and patterning the conductive layer to form the anode 20. The drain is connected to the anode 20 through the connection hole.

Thereafter, the pixel defining layer 21 is formed on the anode, and the pixel defining layer 21 is patterned to form spaced-apart pixel defining units, and the organic light-emitting layer 22 is formed between the pixel defining units and on the part of the pixel defining units.

The manufacturing method of the organic light-emitting layer 22 includes forming functional film layers such as an HTL (hole transport layer), an HIL (hole injection layer), an ETL (electron transport layer) and an EIL (electron injection layer).

Specifically, a traditional Open Mask is used for coating by evaporation organic film layers including the HIL and the HTL. An FMM (fine metal mask) is used for coating by evaporation the organic light-emitting layer such as R (red), G (green), B (blue) luminescent materials. Then, the cathode 23 is formed on the organic light-emitting layer. A capping Layer and LiF layer can be additionally formed. The cathode, capping layer and LiF layer can be formed through the Open Mask.

Figure 3:
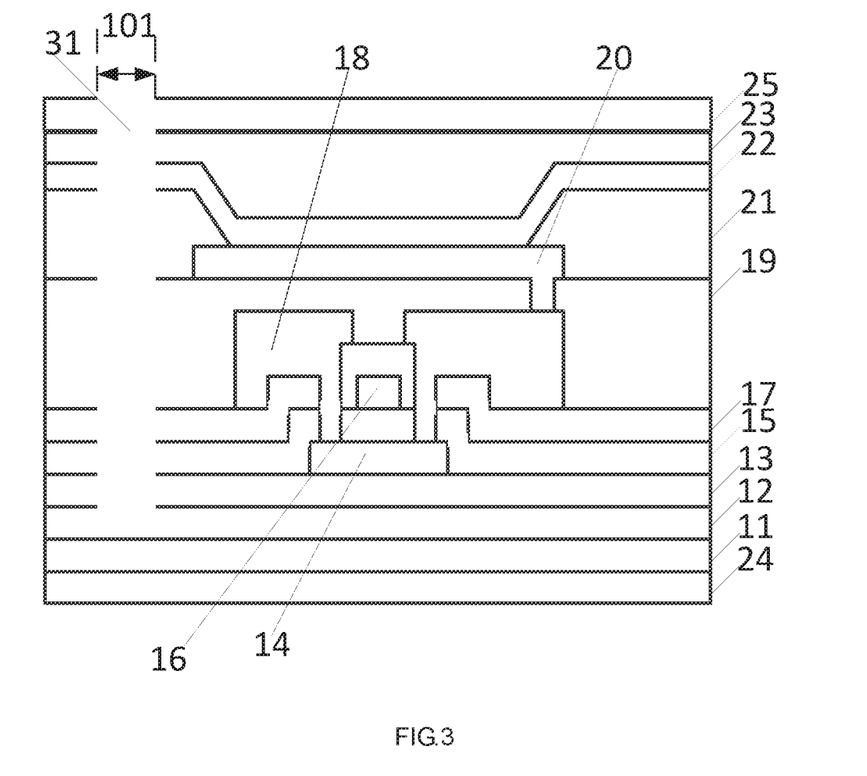
FIG. 3 is a schematic structural view in connection with second and third steps of the manufacturing method of the display screen of the disclosure.

S102, forming a first encapsulation layer on the organic light-emitting display layer.

Referring to FIG. 3, forming the first encapsulation layer 25 is formed on the cathode 23. The cross-sectional structure of the first encapsulation layer 25 can be a single layered structure or a multi-layered structure, and a material of the first encapsulation layer 25 includes at least one of SiNx, SiON, and SiO.

S103, defining a first portion of a via hole in the first encapsulation layer.

Referring to FIG. 3, an orthographic projection of the via hole on the flexible substrate 11 covers an orthographic projection of a preset camera hole on the flexible substrate 11; the first portion 31 of the via hole 31 extends from the first encapsulation layer 25 to an upper surface of the flexible substrate 11.

The first encapsulation layer 25 includes a preset area 101 for defining a via hole; the above step S103 specifically includes:

S1031, removing a part of the first encapsulation layer 25, the organic light emitting display layer, and the switch array layer corresponding to the preset area 101 by an etching process to obtain the first portion 31. The preset area 101 covers the preset camera aperture.

For example, a dry etching is used to etch away a part of the first encapsulation layer 25, the organic light emitting display layer, the switch array layer corresponding to the preset area to define the first portion 31 of the via hole. The preset area 101 covers the preset camera aperture.

A bore diameter of the via hole is larger than a bore diameter of the preset camera hole to prevent from cutting the metal film layer or the organic light emitting display layer when the flexible substrate is subsequently cut, thereby improving the reliability of the encapsulation.

Figure 4:
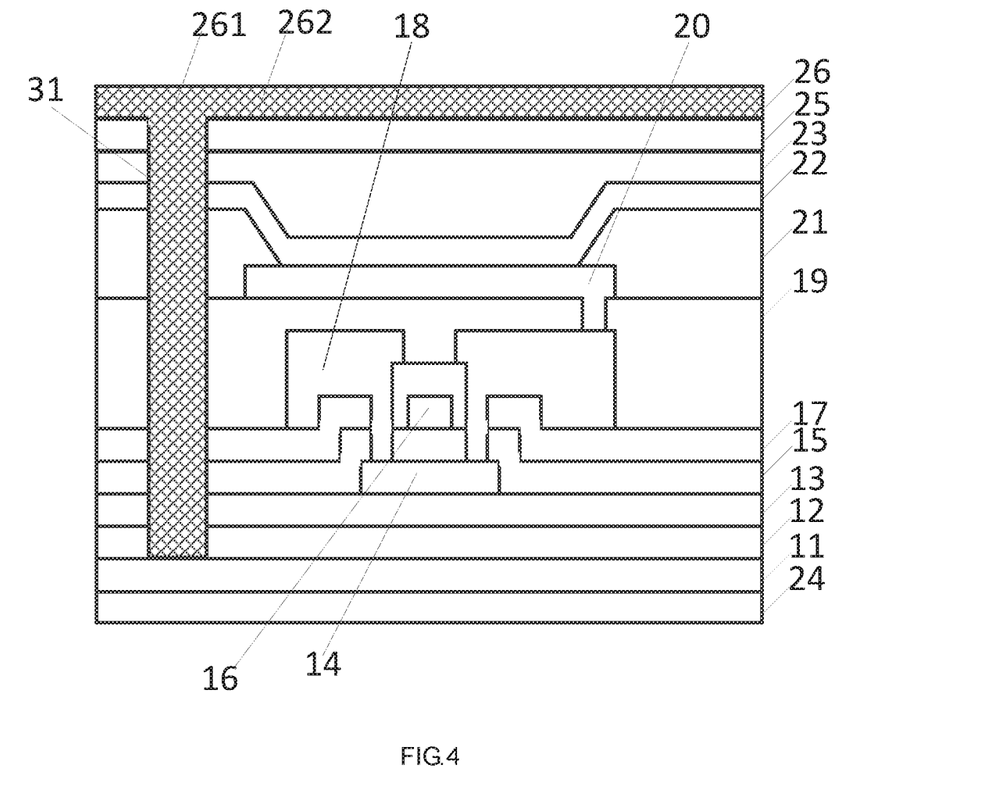
FIG. 4 is a schematic structural view in connection with a fourth steps of the manufacturing method of the display screen of the disclosure.

S104, forming a second encapsulation layer in the first portion of the via hole and on the first encapsulation layer.

Referring to FIG. 4, a second encapsulation layer 26 is formed in the first portion 31 of the via hole and on the first encapsulation layer, that is, the second encapsulation layer 26 is partially formed on the first encapsulation layer 25, and the remaining portion is filled in the first portion 31. The second encapsulation layer 26 includes inorganic layers and organic layers alternately stacked on each other, wherein a material of the inorganic layer can be at least one of SiNx, SiON, and SiO. The first encapsulation layer 25 is mainly used to prevent damage to the organic light emitting display layer when defining the via hole. The second encapsulation layer 26 functions as a whole encapsulation, and particularly encapsulates the periphery of the via hole, thereby effectively improving the reliability of the encapsulation at the position of the camera via hole.

The second encapsulation layer 26 includes a vertical part 261 and a lateral part 262. The vertical part 261 corresponds to the position of the via hole, that is, a vertically arranged part of the second encapsulation layer 26. The lateral part 262 is a portion of the second encapsulation layer 26 that is laterally arranged. The vertical part 261 includes a part of the second encapsulation layer 26 that is located in the first portion 31 of the via hole and above the via hole and corresponding to the via hole. In other words, the vertical portion 261 is a part of second encapsulation layer 26 located in the first portion 31 and directly above the first portion 31.

Figure 5:
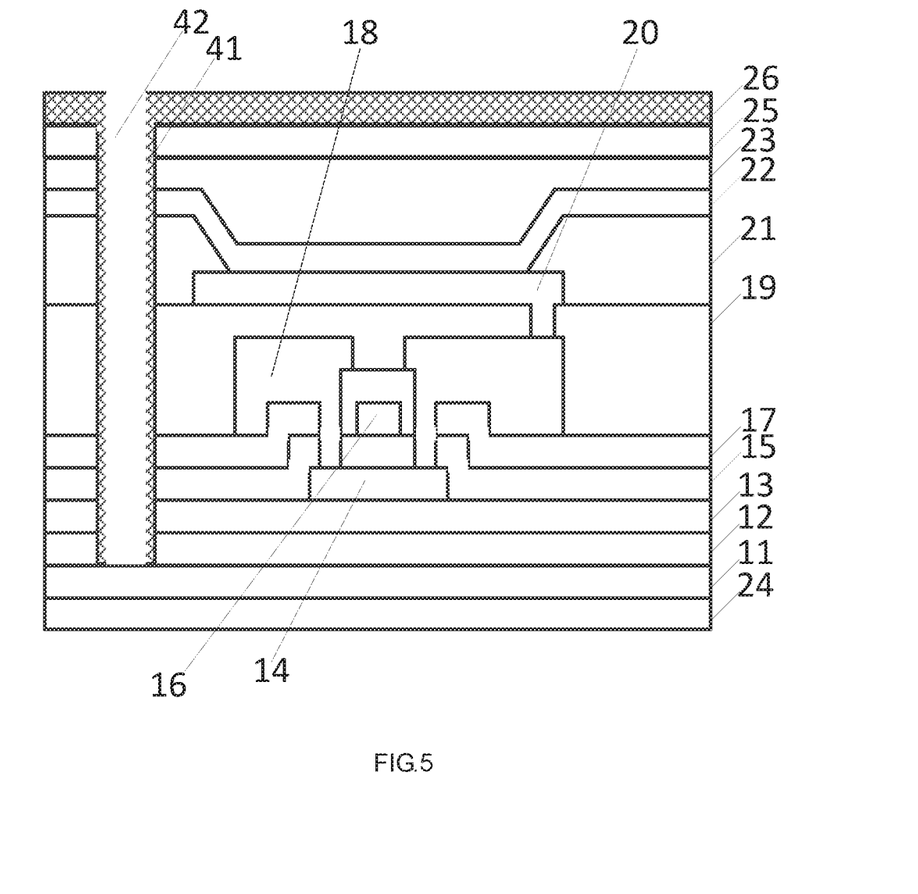
FIG. 5 is a schematic structural view in connection with a fifth steps of the manufacturing method of the display screen of the disclosure.

S105, removing a part of the second encapsulation layer corresponding to a position of the preset camera hole.

Referring to FIG. 5, a part of the second encapsulation layer corresponding to a position of the preset camera hole is removed through the dry etching process.

The vertical part includes a peripheral portion 41 and a middle portion 42. The peripheral portion 41 surrounds a periphery of the middle portion 42 and is adjacent to an inner wall of the via hole. The middle portion 42 corresponds to the position of the preset camera hole. A peripheral portion 41 located in the first portion of the via hole is provided on the circumference of the first portion 31, that is, on the inner wall of the first portion 31.

The step of removing a part of the second encapsulation layer corresponding to a position of the preset camera hole includes:

S1051, removing the middle portion.

Specifically, the middle portion 42 is etched away by the dry etching process to leave the lateral portion 262 and the peripheral portion 42.

Figure 6:
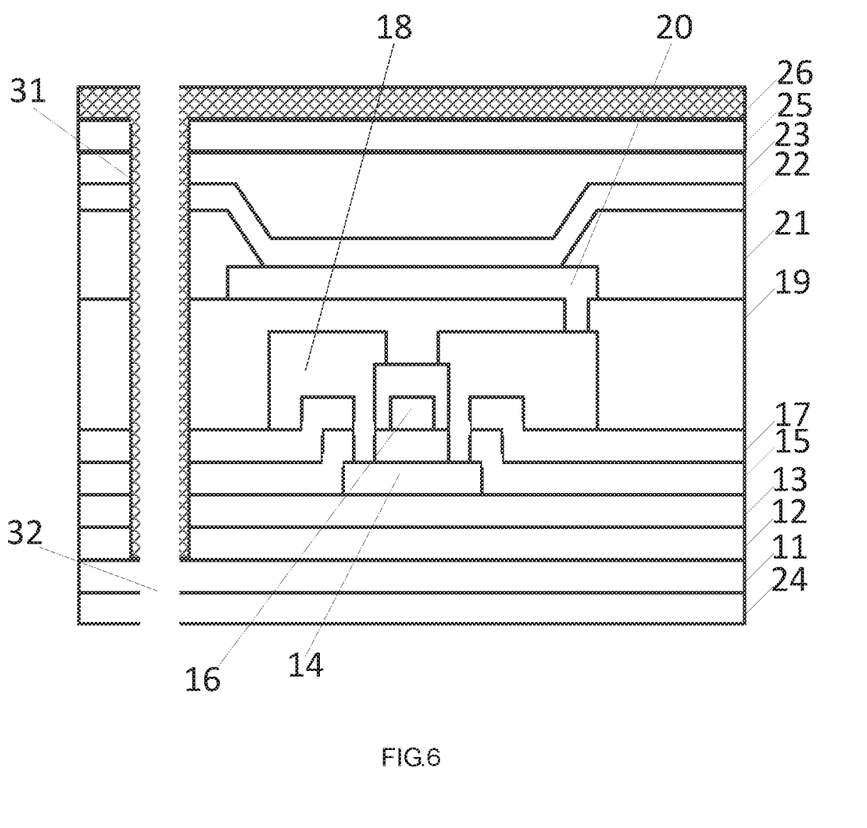
FIG. 6 is a schematic structural view in connection with a sixth steps of the manufacturing method of the display screen of the disclosure.

S106, defining a second portion of the via hole in the flexible substrate to obtain the via hole completely.

Referring to FIG. 6, the second portion 32 is positioned corresponding to the position of the preset camera hole.

In an embodiment, the step of defining a second portion of the via hole in the flexible substrate includes:

S1061, removing, by laser cutting or mechanical cutting, a part of the flexible substrate corresponding to the preset camera hole to define the second part of the via hole.

The flexible substrate 11 corresponding to the preset camera hole is removed by laser cutting or mechanical cutting to form a second portion 32 of the via hole, thereby completing the manufacturing of the via hole, that is, the via hole becomes the camera hole in FIG. 1.

In another embodiment, a cross-sectional structure of the display panel further includes a protection layer, and the protection layer is located below the flexible substrate;

The above step S106, that is, the step of defining the second portion of the via hole on the flexible substrate includes:

S1063, forming a second portion of the via hole in the flexible substrate and the protective layer.

For example, forming a second portion of the via hole in the flexible substrate 11 and the protective layer 24 to obtain the via hole completely. Defining the second portion of the via hole 32 in the flexible substrate 11 includes removing, by laser cutting or mechanical cutting, a part of the flexible substrate corresponding to the preset camera hole to define the second part of the via hole 32.

The disclosure is to provide a method for manufacturing the display screen which includes sequentially forming a switch array layer and an organic light-emitting display layer on a flexible substrate; forming a first encapsulation layer on the organic light-emitting display layer; defining a first portion of a via hole in the first encapsulation layer; forming a second encapsulation layer in the first portion of the via hole and on the first encapsulation layer; removing a part of the second encapsulation layer corresponding to a position of the preset camera hole; defining a second portion of the via hole in the flexible substrate to obtain the via hole completely. Since the inner wall of the via hole of the camera of the disclosure is provided with the encapsulation layer, the encapsulation effect and the reliability of the encapsulation are improved.

Note that the specifications relating to the above embodiments should be construed as exemplary rather than as limitative of the present disclosure. The equivalent variations and modifications on the structures or the process by reference to the specification and the drawings of the disclosure, or application to the other relevant technology fields directly or indirectly should be construed similarly as falling within the protection scope of the disclosure.

What is claimed is:

1. A manufacturing method of a display screen, comprises following steps:
   sequentially forming a switch array layer and an organic light-emitting display layer on a flexible substrate;
   forming a first encapsulation layer on the organic light-emitting display layer;
   defining a first portion of a via hole in the first encapsulation layer, an orthographic projection of the via hole on the flexible substrate covers an orthographic projection of a preset camera hole on the flexible substrate, wherein the first portion of the via hole extends from the first encapsulation layer to an upper surface of the flexible substrate;
   forming a second encapsulation layer in the first portion of the via hole and on the first encapsulation layer;
   removing a part of the second encapsulation layer corresponding to a position of the preset camera hole;
   defining a second portion of the via hole in the flexible substrate to obtain the via hole completely, wherein a bore diameter of the via hole is larger than bore diameter of the preset camera hole, and a material of the first encapsulation layer comprises at least one of SiNx, SiON and SiO.

2. The manufacturing method of the display screen according to claim 1, wherein the second encapsulation layer comprises a vertical part, and the vertical part is positioned corresponding to the position of the through hole,
   wherein the vertical part comprises a middle part, and the middle part corresponds to the position of the preset camera hole; and
   wherein the step of removing a part of second encapsulation layer positioned corresponding to a position of the preset camera hole comprises:
   removing the middle portion.

3. The manufacturing method of the display screen according to claim 2, wherein the vertical part also comprises a peripheral portion surrounding a perimeter of the middle portion.

4. The manufacturing method of the display screen according to claim 2, wherein the vertical part comprises a part of the second encapsulation layer that is located in the first portion of the via hole and above the via hole and corresponding to the via hole.

5. The manufacturing method of the display screen according to claim 1, wherein the first encapsulation layer comprises a preset area, and the preset area is used for defining the via hole; and
   wherein the step of defining a first portion of the via hole in the first encapsulation layer comprises removing the first encapsulation layer and the organic light-emitting display layer and the switch array layer from the preset area to obtain the first portion of the via hole through an etching process.

6. The manufacturing method of the display screen according to claim 1, wherein the step of removing a part of the second encapsulation layer corresponding to a position of the preset camera hole comprises removing the part of the second encapsulation layer corresponding to the position of the preset camera hole through a dry etching process.

7. The manufacturing method of the display screen according to claim 1, wherein a cross-sectional structure of the display panel further comprises a protection layer, and the protection layer is located below the flexible substrate;
   wherein the step of defining a second portion of the through hole in the flexible substrate comprises: forming a second portion of the via hole on the flexible substrate and the protective layer.

8. The manufacturing method of the display screen according to claim 1, where in the step of defining a second portion of the via hole in the flexible substrate comprises removing, by laser cutting or mechanical cutting, a part of the flexible substrate corresponding to the preset camera hole to define the second part of the via hole.

9. The manufacturing method of the display screen according to claim 1, wherein the second encapsulation layer comprises inorganic layers and organic layers alternately stacked on each other.

10. A manufacturing method of a display screen, comprising the following steps:
    sequentially forming a switch array layer and an organic light-emitting display layer on a flexible substrate;
    forming a first encapsulation layer on the organic light-emitting display layer;
    defining a first portion of a via hole in the first encapsulation layer, an orthographic projection of the via hole on the flexible substrate covers an orthographic projection of a preset camera hole on the flexible substrate, wherein the first portion of the via hole extends from the first encapsulation layer to an upper surface of the flexible substrate;
    forming a second encapsulation layer in the first portion of the via hole and on the first encapsulation layer;
    removing a part of the second encapsulation layer corresponding to a position of the preset camera hole;
    defining a second portion of the via hole in the flexible substrate to obtain the via hole completely.

11. The manufacturing method of the display screen according to claim 10, wherein a bore diameter of the via hole is larger than a bore diameter of the preset camera hole.

12. The manufacturing method of the display screen according to claim 10, wherein the second encapsulation layer comprises a vertical part, and the vertical part is positioned corresponding to a position of the via hole;
    wherein the vertical part comprises a middle portion, and the middle portion is positioned corresponding to the position of the preset camera hole; and wherein the step of removing a part of the second encapsulation layer positioned corresponding to a position of the preset camera hole comprises:
removing the middle portion.

13. The manufacturing method of the display screen according to claim 12, wherein the vertical part also comprises a peripheral portion surrounding a perimeter of the middle portion.

14. The manufacturing method of the display screen according to claim 12, wherein the vertical part comprises a part of the second encapsulation layer that is located in the first portion of the via hole and above the via hole and corresponding to the via hole.

15. The manufacturing method of the display screen according to claim 10, wherein the first encapsulation layer comprises a preset area, and the preset area is used for defining the via hole;
wherein the step of defining a first portion of the via in the first encapsulation layer comprises removing the first encapsulation layer and the organic light-emitting display layer and the switch array layer from the preset area to obtain the first portion of the via hole through an etching process.

16. The manufacturing method of the display screen according to claim 10, wherein the step of removing a part of the second encapsulation layer corresponding to a position of the preset camera hole comprises removing the part of the second encapsulation layer corresponding to the position of the preset camera hole through a dry etching process.

17. The manufacturing method of the display screen according to claim 10, wherein a cross-sectional structure of the display panel further comprises a protection layer, and the protection layer is located below the flexible substrate; and
wherein the step of defining a second portion of the via hole in the flexible substrate comprises defining the second portion of the via hole in the flexible substrate and the protective layer.

18. The manufacturing method of the display screen according to claim 10, where in the step of defining a second portion of the via hole in the flexible substrate comprises removing, by laser cutting or mechanical cutting a part of the flexible substrate corresponding to the preset camera hole to define the second portion of the via hole.

19. The manufacturing method of the display screen according to claim 10, wherein a material of the first encapsulation layer comprises at least one of SiNx, SiON and SiO.

20. The manufacturing method of the display screen according to claim 10, wherein the second encapsulation layer comprising inorganic layers and organic layers alternately stacked on each other.

* * * * *